US010416239B2

(12) United States Patent
Mizobe

(10) Patent No.: US 10,416,239 B2
(45) Date of Patent: Sep. 17, 2019

(54) BATTERY MONITORING APPARATUS WITH MONITORING INTEGRATED CIRCUIT SELECTIVELY POWERED BY A HIGH VOLTAGE BATTERY OR LOW VOLTAGE POWER SUPPLY POWERED BY A LOW VOLTAGE BATTERY

(71) Applicant: DENSO CORPORATION, Kariya, Aichi-pref. (JP)

(72) Inventor: Shunichi Mizobe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/040,819

(22) Filed: Jul. 20, 2018

(65) Prior Publication Data

US 2018/0328994 A1 Nov. 15, 2018

Related U.S. Application Data

(63) Continuation of application No. 14/514,594, filed on Oct. 15, 2014, now Pat. No. 10,054,642.

(30) Foreign Application Priority Data

Oct. 15, 2013 (JP) .................................. 2013-214733

(51) Int. Cl.
*G01R 31/36* (2019.01)
*H02J 7/00* (2006.01)
(Continued)

(52) U.S. Cl.
CPC .......... *G01R 31/3835* (2019.01); *H02J 7/047* (2013.01); *G01R 31/396* (2019.01); *H02J 2001/008* (2013.01); *H02J 2007/0067* (2013.01)

(58) Field of Classification Search
CPC ................................ G01R 31/362; H02J 7/047
(Continued)

(56) References Cited

U.S. PATENT DOCUMENTS 5,581,170 A 12/1996 Mammano
5,666,006 A 9/1997 Townsley
(Continued)

FOREIGN PATENT DOCUMENTS

JP 55-53140 4/1980
JP 2003-070179 3/2003
(Continued)

OTHER PUBLICATIONS

Office Action (2 pgs.) dated Aug. 18, 2015 issued in corresponding Japanese Application No. 2013-214733 with an at least partial English-language translation (2 pgs.).
(Continued)

*Primary Examiner* — Robert Grant
*Assistant Examiner* — John T Trischler
(74) *Attorney, Agent, or Firm* — Nixon & Vanderhye PC

(57) ABSTRACT

A battery monitoring apparatus capable of reducing power consumption. At least one monitoring integrated circuit (IC) is electrically connected to a high-voltage battery formed of a plurality of cells and configured to monitor the high-voltage battery in a plurality of modes of operation. A low-voltage power supply circuit can deliver power of a lower voltage than the power of the high-voltage battery to the at least one monitoring IC. A power supply to the at least one monitoring IC is selected from a group of the high-voltage battery and the low-voltage power supply circuit depending on the mode of operation the at least one monitoring IC.

7 Claims, 3 Drawing Sheets

US 10,416,239 B2
Page 2

(51) Int. Cl.
   *G01R 31/3835* (2019.01)
   *H02J 7/04* (2006.01)
   *G01R 31/396* (2019.01)
   *H02J 1/00* (2006.01)

(58) Field of Classification Search
   USPC .......................................................... 324/434
   See application file for complete search history.

(56) References Cited

U.S. PATENT DOCUMENTS

| | | | | |
|---|---|---|---|---|
| 5,780,980 | A | 7/1998 | Naito | |
| 5,796,175 | A | 8/1998 | Itoh | |
| 5,912,092 | A | 6/1999 | Maruyama | |
| 6,191,558 | B1 | 2/2001 | Arai | |
| 6,249,106 | B1 * | 6/2001 | Turner | H02J 7/0032 320/136 |
| 6,313,637 | B1 | 11/2001 | Iino | |
| 6,362,599 | B1 * | 3/2002 | Turner | H02J 7/0063 320/104 |
| 6,422,331 | B1 | 7/2002 | Ochiai | |
| 6,522,960 | B2 | 2/2003 | Nada | |
| 6,548,977 | B2 | 4/2003 | Vu | |
| 6,630,810 | B2 | 10/2003 | Takemasa | |
| 6,646,845 | B1 * | 11/2003 | Turner | H02J 9/002 307/10.7 |
| 6,653,745 | B1 | 11/2003 | Masaki | |
| 6,727,676 | B2 * | 4/2004 | Ochiai | B60K 6/485 320/104 |
| 6,747,371 | B2 * | 6/2004 | Kotlow | H02J 7/1461 307/66 |
| 6,752,226 | B2 | 6/2004 | Naito | |
| 6,923,279 | B2 | 8/2005 | Shimane | |
| 6,982,499 | B1 | 1/2006 | Kachi | |
| 7,248,020 | B2 | 7/2007 | Hidaka | |
| 7,358,690 | B2 | 4/2008 | Kifuku | |
| 7,405,579 | B2 | 7/2008 | Okamoto | |
| 7,443,138 | B2 | 10/2008 | Ishikawa | |
| 7,471,065 | B2 | 12/2008 | Emori | |
| 7,486,050 | B2 | 2/2009 | Hidaka | |
| 7,511,457 | B2 | 3/2009 | Emori | |
| 7,595,610 | B2 | 9/2009 | Poff | |
| 7,764,044 | B2 | 7/2010 | Ishikawa | |
| 7,791,292 | B2 | 9/2010 | Glasl | |
| 7,884,567 | B2 | 2/2011 | Kim | |
| 7,986,124 | B2 | 7/2011 | Stone | |
| 8,159,184 | B2 | 4/2012 | Emori | |
| 8,204,651 | B2 | 6/2012 | Tachibana | |
| 8,212,571 | B2 | 7/2012 | Emori | |
| 8,281,167 | B2 | 10/2012 | Nakamura | |
| 8,339,099 | B2 | 12/2012 | Emori | |
| 8,390,145 | B2 * | 3/2013 | Harding | B60R 16/033 307/10.1 |
| 8,427,107 | B2 * | 4/2013 | Firehammer | H02J 7/0016 320/128 |
| 8,541,979 | B2 * | 9/2013 | Firehammer | H02J 7/0014 320/107 |
| 8,581,557 | B2 | 11/2013 | Kanoh | |
| 8,643,334 | B2 * | 2/2014 | Kuo | H02J 7/0019 320/116 |
| 8,666,687 | B2 * | 3/2014 | Kaneko | H01M 10/441 702/63 |
| 8,723,482 | B2 * | 5/2014 | Dao | H01M 10/441 320/104 |
| 8,723,527 | B2 | 5/2014 | Kudo | |
| 8,736,101 | B2 | 5/2014 | Masuda | |
| 8,736,229 | B2 | 5/2014 | Kawahara | |
| 8,779,718 | B2 | 7/2014 | Stone | |
| 8,786,256 | B2 | 7/2014 | Emori | |
| 8,786,289 | B2 | 7/2014 | Sekiguchi | |
| 8,791,668 | B2 | 7/2014 | Emori | |
| 8,884,584 | B2 | 11/2014 | Emori | |
| 8,912,756 | B2 | 12/2014 | Emori | |
| 8,917,039 | B2 | 12/2014 | Yugo | |
| 8,924,397 | B2 * | 12/2014 | Ogikubo | G06F 16/70 707/752 |
| 8,954,219 | B2 | 2/2015 | Kobayashi | |
| 8,970,062 | B2 | 3/2015 | Kunimitsu | |
| 9,007,001 | B2 | 4/2015 | Sugiyama | |
| 9,190,861 | B2 | 11/2015 | Kim | |
| 9,194,904 | B2 * | 11/2015 | Wang | G01R 31/025 |
| 9,356,451 | B2 | 5/2016 | Kawahara | |
| 9,397,370 | B2 | 7/2016 | Nebrigic | |
| 9,404,975 | B2 | 8/2016 | Kudo | |
| 9,431,837 | B2 * | 8/2016 | Brockman | H02J 7/0047 |
| 9,437,850 | B2 * | 9/2016 | Brockman | H02J 7/0052 |
| 9,450,274 | B2 * | 9/2016 | Vo | H01M 10/4257 |
| 9,559,536 | B2 * | 1/2017 | Brockman | H02J 7/0047 |
| 9,647,463 | B2 * | 5/2017 | Brandl | H02J 7/0016 |
| 9,692,240 | B2 * | 6/2017 | Brockman | H01M 10/4257 |
| 9,793,722 | B2 * | 10/2017 | Tamura | B60R 16/033 |
| 9,945,910 | B2 * | 4/2018 | Kiuchi | H01M 10/48 |
| 10,054,642 | B2 * | 8/2018 | Mizobe | H02J 7/047 |
| 10,074,997 | B2 * | 9/2018 | Vo | H01M 10/4257 |
| 10,090,685 | B2 * | 10/2018 | Shim | H02J 7/0021 |
| 2001/0017532 | A1 | 8/2001 | Han | |
| 2003/0044689 | A1 | 3/2003 | Miyazaki et al. | |
| 2003/0117113 | A1 | 6/2003 | Takemasa | |
| 2003/0132730 | A1 * | 7/2003 | Ochiai | B60K 6/485 320/104 |
| 2003/0197484 | A1 * | 10/2003 | Kotlow | H02J 7/1461 320/104 |
| 2004/0178768 | A1 | 9/2004 | Miyazaki et al. | |
| 2005/0062456 | A1 | 3/2005 | Stone | |
| 2005/0242667 | A1 | 11/2005 | Emori | |
| 2005/0242775 | A1 | 11/2005 | Miyazaki et al. | |
| 2006/0012337 | A1 | 1/2006 | Hidaka | |
| 2006/0071630 | A1 | 4/2006 | Dame | |
| 2006/0110655 | A1 | 5/2006 | Wirdel | |
| 2007/0018613 | A1 | 1/2007 | Miyazaki et al. | |
| 2007/0120529 | A1 | 5/2007 | Ishikawa et al. | |
| 2007/0132457 | A1 | 6/2007 | Okamoto | |
| 2007/0145944 | A1 | 6/2007 | Poff | |
| 2007/0145951 | A1 | 6/2007 | Hidaka | |
| 2007/0212596 | A1 | 9/2007 | Nebrigic | |
| 2008/0061740 | A1 | 3/2008 | Miyazaki et al. | |
| 2008/0067978 | A1 | 3/2008 | Miyazaki et al. | |
| 2008/0079395 | A1 | 4/2008 | Miyazaki et al. | |
| 2008/0116843 | A1 | 5/2008 | Kim | |
| 2008/0177444 | A1 | 7/2008 | Tachibana | |
| 2008/0231226 | A1 | 9/2008 | Hoffman | |
| 2009/0085516 | A1 | 4/2009 | Emori | |
| 2009/0091332 | A1 | 4/2009 | Emori | |
| 2009/0169987 | A1 | 7/2009 | Miyazaki et al. | |
| 2009/0261781 | A1 | 10/2009 | Miyazaki et al. | |
| 2009/0284223 | A1 | 11/2009 | Miyazaki et al. | |
| 2009/0284224 | A1 | 11/2009 | Miyazaki et al. | |
| 2009/0302802 | A1 | 12/2009 | Miyazaki et al. | |
| 2010/0013437 | A1 | 1/2010 | Poff | |
| 2010/0045105 | A1 | 2/2010 | Bovio | |
| 2010/0244782 | A1 | 9/2010 | Nagayama | |
| 2010/0244847 | A1 * | 9/2010 | Kudo | B60L 3/0046 324/433 |
| 2010/0286938 | A1 * | 11/2010 | Kaneko | H01M 10/441 702/63 |
| 2011/0001352 | A1 * | 1/2011 | Tamura | B60R 16/033 307/9.1 |
| 2011/0082869 | A1 * | 4/2011 | Ogikubo | G06F 16/70 707/756 |
| 2011/0101774 | A1 | 5/2011 | Wagner | |
| 2011/0144852 | A1 | 6/2011 | Kobayashi | |
| 2011/0156656 | A1 | 6/2011 | Saito | |
| 2011/0254560 | A1 | 10/2011 | Stone | |
| 2011/0260770 | A1 | 10/2011 | Sekiguchi | |
| 2011/0309795 | A1 * | 12/2011 | Firehammer | H02J 7/0014 320/118 |
| 2011/0309796 | A1 * | 12/2011 | Firehammer | H02J 7/0018 320/118 |
| 2011/0309799 | A1 * | 12/2011 | Firehammer | H02J 7/0016 320/134 |
| 2011/0316520 | A1 | 12/2011 | Kawahara | |
| 2012/0256489 | A1 | 10/2012 | Perper | |

(56) References Cited

U.S. PATENT DOCUMENTS

| | | | |
|---|---|---|---|
| 2012/0262121 A1* | 10/2012 | Kuo | H02J 7/0018 320/126 |
| 2012/0286734 A1 | 11/2012 | Miyazaki et al. | |
| 2012/0299377 A1 | 11/2012 | Masuda | |
| 2013/0076129 A1 | 3/2013 | Kunimitsu | |
| 2013/0093394 A1 | 4/2013 | Kyasu | |
| 2013/0106320 A1 | 5/2013 | Yugo | |
| 2013/0175972 A1 | 7/2013 | Akiyama | |
| 2013/0207484 A1 | 8/2013 | Okuzono | |
| 2014/0028256 A1 | 1/2014 | Sugiyama | |
| 2014/0035532 A1* | 2/2014 | Brandl | H02J 7/0016 320/128 |
| 2014/0091767 A1* | 4/2014 | Tamura | B60R 16/033 320/126 |
| 2014/0159671 A1 | 6/2014 | Kawahara | |
| 2014/0159739 A1* | 6/2014 | Kudo | B60L 3/0046 324/434 |
| 2014/0236509 A1 | 8/2014 | Kim | |
| 2014/0278169 A1 | 9/2014 | Kim | |
| 2014/0312828 A1* | 10/2014 | Vo | H01M 10/4257 320/103 |
| 2014/0322567 A1 | 10/2014 | Stone | |
| 2015/0102820 A1 | 4/2015 | Mizobe et al. | |
| 2015/0306973 A1 | 10/2015 | Gunnerud | |
| 2016/0169976 A1* | 6/2016 | Miura | G01R 31/362 324/434 |
| 2016/0185237 A1 | 6/2016 | Ha | |
| 2016/0303977 A1 | 10/2016 | Kudo | |
| 2017/0054306 A1* | 2/2017 | Vo | H01M 10/4257 |

FOREIGN PATENT DOCUMENTS

| | | |
|---|---|---|
| JP | 2007-151256 | 6/2007 |
| JP | 2008-54416 | 3/2008 |
| JP | 2011-232161 | 11/2011 |

OTHER PUBLICATIONS

U.S. Appl. No. 14/514,594, filed Oct. 15, 2014 (19 pgs.).

* cited by examiner

BATTERY MONITORING APPARATUS WITH MONITORING INTEGRATED CIRCUIT SELECTIVELY POWERED BY A HIGH VOLTAGE BATTERY OR LOW VOLTAGE POWER SUPPLY POWERED BY A LOW VOLTAGE BATTERY

CROSS-REFERENCE TO RELATED APPLICATION

This is a continuation of U.S. application Ser. No. 14/514,594, filed Oct. 15, 2014, which is based on and claims the benefit of priority from earlier Japanese Patent Application No. 2013-214733 filed Oct. 15, 2013, the disclosures of both of which are incorporated herein by reference.

BACKGROUND

Technical Field

The present invention relates to a battery monitoring apparatus including monitoring integrated circuits (ICs) for monitoring a high-voltage battery formed of a plurality of cells.

Related Art

A known battery monitoring apparatus, as disclosed in Japanese Patent Application Laid-Open Publication No. 2003-70179, includes monitoring ICs for monitoring and adjusting the capacity of each of a plurality of cells forming a high-voltage battery, where the monitoring ICs are supplied with power from the high-voltage battery.

The apparatus disclosed in Japanese Patent Application Laid-Open Publication No. 2003-70179 is configured such that the monitoring ICs are always supplied with power from the high-voltage battery, which leads to increased power consumption for the high-voltage battery to drive the cells. The power consumption varies with the monitoring ICs of the high-voltage battery, which will cause variations in capacity with the cells. Control with use of the high-voltage battery is tailored to one of the cells having a minimum capacity, which may prevent the high-voltage battery from delivering its inherent performance in the presence of variations in capacity with the cells.

In consideration of the foregoing, it would therefore be desirable to have a battery monitoring apparatus capable of reducing the high-voltage battery power consumption of monitoring ICs of the apparatus.

SUMMARY

In accordance with an exemplary embodiment of the present invention, there is provided a battery monitoring apparatus including: at least one monitoring integrated circuit (IC) that is electrically connected to a high-voltage battery formed of a plurality of cells and configured to monitor the high-voltage battery in a plurality of modes of operation; and a low-voltage power supply circuit that can deliver power of a lower voltage than the power of the high-voltage battery to the at least one monitoring IC. In the apparatus, a power supply to the at least one monitoring IC is selected from a group of the high-voltage battery and the low-voltage power supply circuit depending on the mode of operation of the at least one monitoring IC.

With this configuration, a power supply used to supply power to the monitoring ICs can be selected depending on modes of operation of the monitoring ICs, which can reduce power supplied from the high-voltage battery to the monitoring ICs. This can reduce variations in the capacity of each of the cells of the high-voltage battery caused by power supply to the monitoring ICs and allow the high-voltage battery to deliver its inherent performance.

DESCRIPTION OF SPECIFIC EMBODIMENTS

The present invention now will be described more fully hereinafter with reference to the accompanying drawings. A battery monitoring apparatus in accordance with one embodiment of the present invention may be mounted in a hybrid (HV) vehicle including a lithium ion battery, which is a high-voltage battery formed of a plurality of cells, and a lead battery, which is a low-voltage battery, and is configured to monitor capacities of the respective cells of the lithium ion battery.

Figure 1:
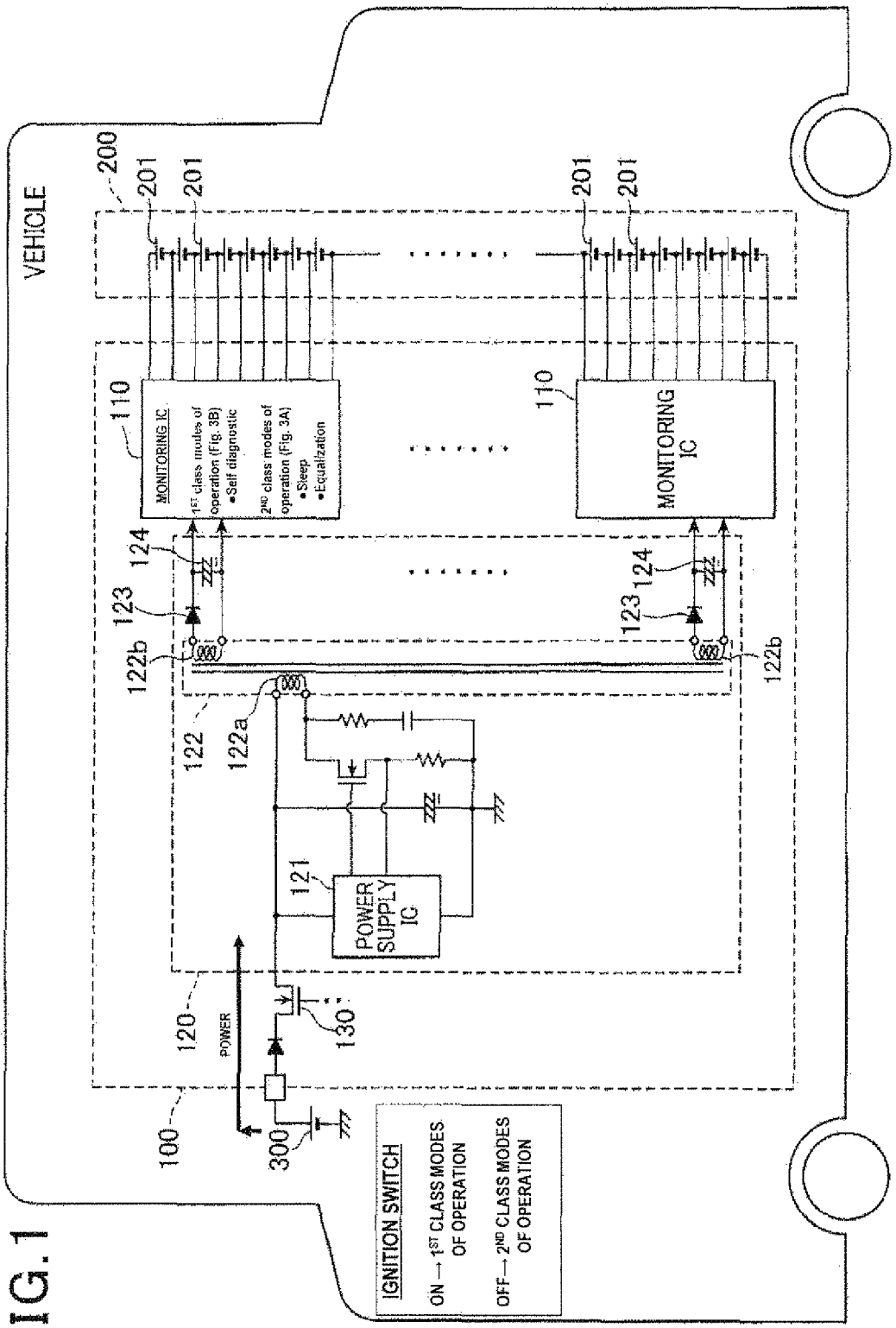
FIG. 1 is a schematic circuit block diagram illustrating the overall configuration of a battery monitoring apparatus in accordance with one embodiment of the present invention.

FIG. 1 is a circuit block diagram of a battery monitoring apparatus of the present embodiment.

The battery monitoring apparatus 100 includes a plurality of monitoring ICs 110, and an insulating power supply block 120, which is a low-voltage power supply circuit, configured to supply power to the plurality of monitoring ICs 110. The battery monitoring apparatus 100 is configured to receive control signals from a higher-level ECU (not shown).

The insulating power supply block 120 includes a power supply integrated circuit (IC) 121 and a centralized transformer 122. The centralized transformer 122 is formed of a single primary coil 122a and a plurality of secondary coils 122b. Passing a current through the primary coil 122a simultaneously induces currents flowing through the plurality of secondary coils 122b, which enables parallel power supply to the plurality of monitoring ICs 110. The centralized transformer 122 can also serve as an insulator. A current produced in each of the secondary coils 122b is delivered to corresponding one of the monitoring ICs 110 through a rectification circuit formed of a diode 123 and a capacitor 124. The power supply IC 121 is configured to control the centralized transformer 122 on the basis of the control signals received from the higher-level ECU to regulate power to be delivered to the plurality of monitoring ICs 110.

The battery monitoring apparatus 100 is electrically connected to the high-voltage battery 200 formed of a plurality of cells 201 and to the low-voltage battery 300, thereby enabling power supply from either or both of them. The high-voltage battery 200 and the low-voltage battery 300 may be charged by chargers (not shown), for example, by a high-voltage battery charger and a low-voltage battery charger, respectively. The monitoring ICs 110 are configured to acquire voltages of the plurality of cells 201 of the high-voltage battery 200 and control the cells in response to the acquired voltages of them. In the present embodiment, each monitoring IC 110 may be responsible for controlling some of the plurality of cells of the high-voltage battery 200, that is, a predetermined number of cells which are subject to control of the monitoring IC 110.

The low-voltage battery 300 is electrically connected to the insulating power supply block 120 through a transistor 130 that is an external switching element. Switching of the transistor 130 between open and closed states is controlled in response to the control signals from the higher-level ECU.

Figure 2:
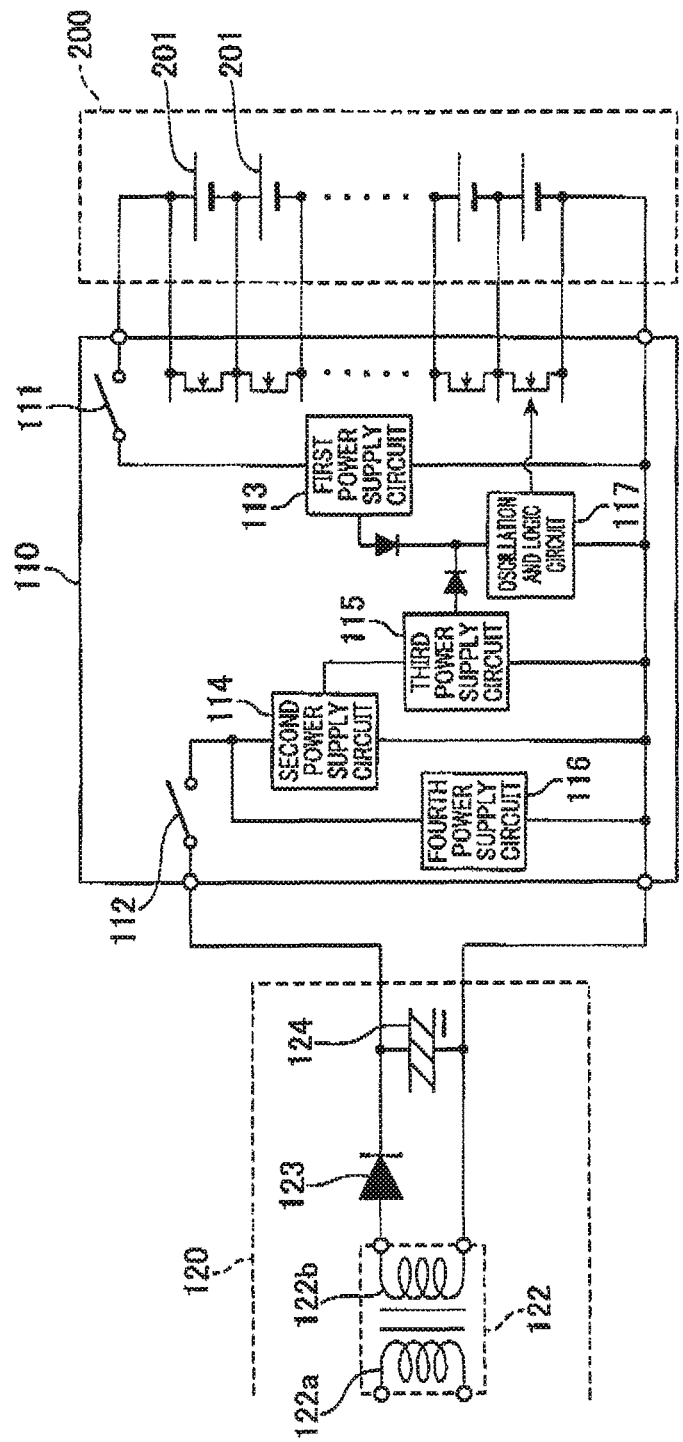
FIG. 2 is a schematic circuit block diagram of one of monitoring ICs within the battery monitoring apparatus of FIG. 1.

FIG. 2 is a schematic circuit block diagram for each of the monitoring ICs of the battery monitoring apparatus 100. Since the monitoring ICs are similar in configuration to each other, one of the monitoring ICs will now be explained. The explanation for the other monitoring ICs will not be repeated.

The monitoring IC 110 includes a first switch 111, a second switch 112, a first power supply circuit 113, a second power supply circuit 114, a third power supply circuit 115, a fourth power supply circuit 116, and an oscillation and logic circuit 117. The oscillation and logic circuit 117 includes a high-voltage driven section and a low-voltage driven section. The high-voltage driven section can be driven at a lower current value as compared with the low-voltage driven section. The monitoring IC 110 may include a memory (not shown).

Modes of operation for the monitoring IC 110 will now be explained.

Modes of operation for the monitoring IC 110 are classified into first-class modes of operation, in which the power consumption is equal to or greater than a predetermined value, and second-class modes of operation, in which the power consumption is less than the predetermined value. The first- and second-class modes of operation are predefined and stored in a memory (not shown) within the higher-level ECU.

The first-class modes of operation include a self-diagnostic mode of operation and the like. In the self-diagnostic mode of operation, the monitoring IC 110 acquires, for each of the cells 201 associated with the monitoring IC 110, a voltage across the cell 201, and calculates an internal resistance and a capacity of the cell 201 on the basis of the acquired voltage of the cell 201. The monitoring IC 110 further calculates, for each of the cells 201 associated with the monitoring IC 110, an amount of voltage drop for a predetermined time period to determine a deteriorating condition of the cell 201. The calculated internal resistance and capacity and the determined deteriorating condition for each of the cells 201 associated with the monitoring IC 110 are to be stored in the memory of the monitoring IC 110.

The calculated internal resistance and capacity and the determined deteriorating condition for each of the cells 201 associated with the monitoring IC 110 are to be transmitted to the higher-level ECU. The higher-level ECU controls the high-voltage battery charger on the basis of the calculated internal resistance and capacity and the determined deteriorating condition received for each of the cells 201 associated with the monitoring IC 110. The monitoring IC 110 determines, for each of the cells 201 associated with the monitoring IC 110, whether or not the capacity of the cell 201 is less than a first predetermined threshold. When it is determined that the capacity of the cell 201 is less than the first predetermined threshold, the monitoring IC 110 determines that the cell 201 is in an over-discharge condition and charges the cell 201 by adjusting the voltage of the high-voltage battery charger. When it is determined that the capacity of the cell 201 is greater than a second threshold that is greater than the first predetermined threshold, the monitoring IC 110 determines that the cell 201 is in an over-charge condition and discharges the cell 201 by adjusting the voltage of the high-voltage battery charger.

The second-class modes of operation include an equalization mode of operation and a sleep mode of operation and the like.

The monitoring IC 110 transitions into the equalization mode of operation at predetermined time intervals to perform an equalizing operation. In the equalizing operation, the monitoring IC 110 acquires a voltage across each of the cells 201 associated with the monitoring IC 110 and compares the voltages of the cells 201 associated with the monitoring IC 110 with each other. To equalize the capacity between the cells 201 associated with the monitoring IC 110, the monitoring IC 110 discharges the cell 201 having a relatively high voltage via the oscillation and logic circuit 117, thereby reducing the capacity of the relatively high voltage cell 201. This equalizing operation is repeated until a difference in voltage between the highest voltage cell 201 and the lowest voltage cell 201 becomes less than a predetermined value so that the capacities of the cells 201 associated with the monitoring IC 110 become almost equal to each other.

The monitoring IC 110 transitions into the sleep mode of operation when a vehicle-mounted ignition switch is turned off. In the sleep mode of operation, an idle mode of operation is performed where only a timer (not shown) and the memory included in control mean (for various control operations) of the monitoring IC 110 are powered by the first power supply circuit 113 and power to the other components included in the control mean is cut. That is, none of various control functions are executed.

Upon transitions between the first-class modes of operation and the second-class modes of operation, the first switch 111 and the second switch 112 are controlled to select a power supply.

Open and closed states of the first and second switches 111, 112 in the first-class modes of operation will now be explained.

In the first-class modes of operation, the first switch 111 and the second switch 112 are both closed. A current input from the high-voltage battery 200 is kept at a specified voltage by the first power supply circuit 113 to be used for driving the high-voltage driven section of the oscillation and logic circuit 117.

A current input from the insulating power supply block 120 is stepped down to a specified voltage by the second power supply circuit 114 to be fed to the third power supply circuit 115 that is a digital power supply circuit within the monitoring IC 110. The current output from the third power supply circuit 115 is used for driving the low-voltage driven section of the oscillation and logic circuit 117.

The fourth power supply circuit 116 is a power supply circuit for driving a photocoupler (not shown). The fourth power supply circuit 116 steps down the power input from the insulating power supply block 120 to a specified voltage for driving the photocoupler configured to receive signals from and transmit signals to the higher-level ECU. In the first-class modes of operation, the photocoupler is used to transmit signals indicative of the internal resistance, the capacity, and the deteriorating condition of each of the cells 201, to the higher-level ECU.

There will now be explained how the switches are controlled upon transitions between the first-class modes of operation and the second-class modes of operation.

Figure 3A:
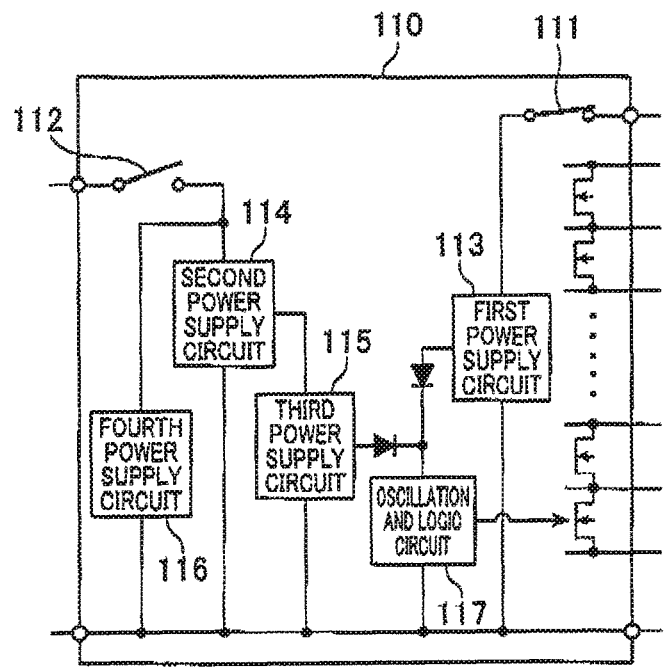
FIG. 3A is a schematic illustrating second-class modes of operation of one of monitoring ICs within the battery monitoring apparatus of FIG. 1.

Upon transitions from the first-class modes of operation to the second-class modes of operation, a blocking signal for blocking the current input from the insulating power supply block 120 is transmitted from the higher-level ECU to the battery monitoring apparatus 100 as the monitoring IC 110 doesn't need any current input from the insulating power supply block 120. Upon receipt of the blocking signal, as shown in FIG. 3A, the battery monitoring apparatus 100 keeps the first switch 111 closed and opens the second switch 112. In addition, a termination signal is transmitted from the higher-level ECU to the battery monitoring apparatus 100 for terminating the insulating power supply block 120 by turning off the transistor 130. Power from the low-voltage battery 300 to the insulating power supply block 120 is thereby cut.

Figure 3B:
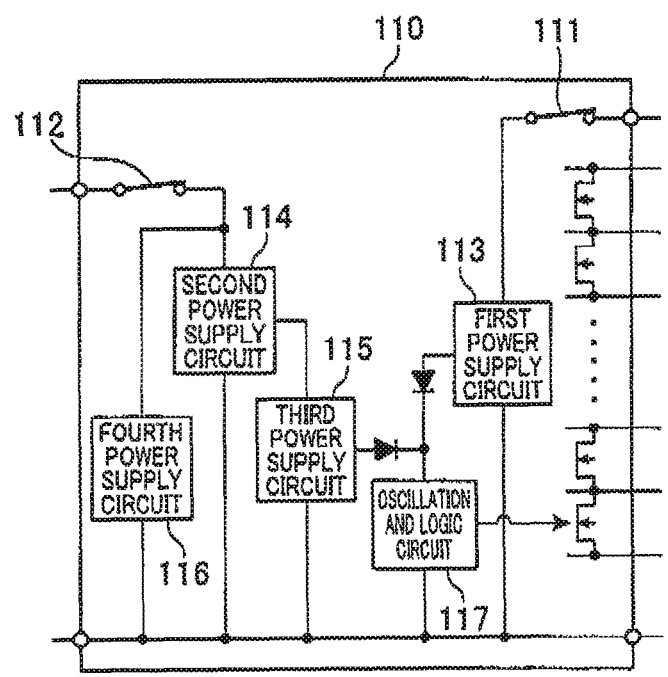
FIG. 3B is a schematic illustrating first-class modes of operation of one of monitoring ICs within the battery monitoring apparatus of FIG. 1.

Upon transitions from the second-class modes of operation to the first-class modes of operation, as shown in FIG. 3B, the battery monitoring apparatus 100 keeps the first switch 111 closed and closes the second switch 112 and the transistor 130 in response to the control signal from the higher-level ECU. The closed state of the transistor 130 allows the power supply IC 121 to be supplied with power and control of the insulating power supply block 120 is thereby initiated. Since the centralized transformer 122 supplies power to the plurality of monitoring ICs 110 simultaneously, circuits within the respective monitoring ICs 110, powered by the insulating power supply block 120, will be activated simultaneously.

The battery monitoring apparatus 100 configured as above can provide the following advantages.

As above, a power supply used to supply power to the monitoring ICs 110 can be selected depending on modes of operation of the monitoring ICs 110, which can reduce power supplied from the high-voltage battery 200 to the monitoring ICs 110. This can reduce variations in the capacity of each of the cells 201 of the high-voltage battery 200 caused by power supply to the monitoring ICs 110 and allow the high-voltage battery 200 to deliver its inherent performance.

The presence of a high-voltage driven section and a low-voltage driven section within each of the monitoring ICs 110 allows not only the low-voltage battery 300, but also the high-voltage battery 200 to be used as a power supply to the monitoring IC 110 in the first-class modes of operation. This eliminates the need for boosting the voltage of the low-voltage battery 300, thereby reducing power losses caused by boosting the voltage of the low-voltage battery 300.

Circuits driven by the high-voltage battery 200 may be configured to consume a small amount of current, which can reduce heat generation in the monitoring ICs 110 and downsize the monitoring ICs 110. This can also reduce the consumption of power from the high-voltage battery 200.

The presence of a voltage translator circuit and a diode within the monitoring IC 110 may respectively lead to power consumption caused by operation of the voltage translator circuit and leak current in the diode. As such, upon selection of a source of power, power supplied from an unselected source of power is blocked by using the first switch 111 and the second switch 112, which can save power.

Even with the second switch 112 kept open, the presence of the rectification circuit at the output end of the insulating power supply block 120 may lead to power consumption caused by driving the centralized transformer 122. Such power consumption in the rectification circuit may be suppressed by blocking power supply from the low-voltage battery 300 to the insulating power supply block 120 via the transistor 130 and thereby stopping driving the centralized transformer 122.

Use of the centralized transformer 122 as a low-voltage power supply circuit allows the single power supply IC 121 to control the insulating power supply block 120, which leads to reduced manufacturing costs.

Use of the centralized transformer 122 as a low-voltage power supply circuit allows parallel power supply to the plurality of monitoring ICs 110. This can reduce a wasteful wait time caused by delay in power supply to some of the monitoring ICs 110 upon initiation of the power supply to the monitoring ICs 110. In addition, terminating the power supply to the insulating power supply block 120 enables terminating the power supply to the plurality of monitoring ICs 110 simultaneously. This can eliminate the need for transmission of a termination signal to each of the plurality of the monitoring ICs 110, which can reduce the processing burden on the higher-level ECU.

The low-voltage battery 300 is electrically connected to the insulating power supply block 120 through the transistor 130. Hence control signals don't have to be transmitted to the power supply IC 121 upon initiation and termination of the power supply from the insulating power supply block 120 to the monitoring ICs 110, which simplifies the process.

<Modifications>

In the embodiment set forth above, the second switches 112 and the transistor 130 are both provided in the battery monitoring apparatus 100. Alternatively, only either one of the second switches 112 and the transistor 130 may be provided in the battery monitoring apparatus 100.

In the embodiment set forth above, the transistor 130 is provided in the battery monitoring apparatus 100, where the insulating power supply block 120 is disconnected from the low-voltage battery 300 by opening the transistor 130. Alternatively, the transistor 130 may be removed, where driving the insulating power supply block 120 may be terminated by transmitting a termination signal from the higher-level ECU to the power supply IC 121.

In the embodiment set forth above, the self-diagnostic mode of operation is included in the first-class modes of operation, and the equalization mode of operation and the sleep mode of operation are included in the second-class modes of operation. Alternatively, another mode of operation may be included in the first- or second-class modes of operation depending on its power consumption.

In the embodiment set forth above, the centralized transformer 122 is provided in the single insulating power supply block 120, and power is supplied from the single insulating power supply block 120 to the plurality of monitoring ICs 110. Alternatively, a plurality of insulating power supply blocks 120 may be provided, one for each of the plurality of monitoring ICs 110, where power is supplied from each of the plurality of insulating power supply blocks 120 to a corresponding one of the plurality of monitoring ICs 110. In such an alternative embodiment, each of the plurality of insulating power supply blocks 120 may include a transformer formed of a pair of primary and secondary coils 122a, 122b.

In the embodiment set forth above, whether to select the first-class modes of operation or the second-class modes of operation is determined depending on whether the ignition switch is on or off. More specifically, when the ignition switch is on where the battery monitoring apparatus 100 conducts the self-diagnostic mode control, the first-class modes of operation are selected. When the ignition switch is off where the battery monitoring apparatus 100 is in sleep mode, the second-class modes of operation are selected.

As above, whether to select the first-class modes of operation or the second-class modes of operation is determined only on the basis of whether the ignition switch is on or off, which simplifies the process of determining the modes of operation.

Reference has been made to specified embodiments in describing the invention. However, additions, deletions substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed is:

1. A monitoring integrated circuit (IC) incorporated in a battery monitoring apparatus, the monitoring IC comprising:
    an electrical connection to a high-voltage battery formed of a plurality of cells; and
    circuitry configured to monitor the high-voltage battery in a plurality of modes of operation, the plurality of modes of operation including at least one first-class mode of operation, in which the power consumption of the monitoring IC is equal to or greater than a predetermined value, and at least one second-class mode of operation, in which the power consumption of the monitoring IC is less than the predetermined value, wherein:
    the apparatus comprises a low-voltage power supply circuit configured to deliver power that is lower in voltage than the power of the high-voltage battery from a low-voltage battery to the monitoring IC, the low-voltage battery being separate from the high-voltage battery,
    a power supply to the monitoring IC is selected from a group of the high-voltage battery and the low-voltage power supply circuit depending on the mode of operation of the monitoring IC,
    the apparatus is mounted in a vehicle including an ignition switch,
    when the ignition switch is on, the battery monitoring apparatus is placed in one of the at least one first-class mode of operation and the monitoring IC is then powered by the low-voltage power supply circuit,
    when the ignition switch is off, the battery monitoring apparatus is placed in one of the at least one second-class mode of operation and the monitoring IC is then powered only by the high-voltage battery,
    the at least one second-class mode of operation includes a sleep mode of operation, in which none of various control functions are executed, and an equalization mode of operation, in which the plurality of cells forming the high-voltage battery are equalized in capacity, and
    the low-voltage power supply circuit comprises a transformer formed of a pair of primary and secondary coils, and power originating from the low-voltage battery is delivered to the monitoring IC through the transformer of the low-voltage power supply circuit.

2. The monitoring integrated circuit according to claim 1, wherein, in the at least one first-class mode of operation, the monitoring IC is further powered by the high-voltage battery.

3. The monitoring integrated circuit according to claim 1, wherein selection of the power supply is implemented by turning on and off at least one switch.

4. The monitoring integrated circuit according to claim 1, wherein
    the low-voltage power supply circuit comprises a power supply integrated circuit (IC) configured to control power supply from the low-voltage battery to the monitoring IC, and
    when the power from the low-voltage power supply circuit to the monitoring IC is cut, driving the power supply IC is terminated.

5. The monitoring integrated circuit according to claim 1, wherein the low-voltage battery and the low-voltage power supply circuit are electrically connected to each other through an external switching element.

6. The monitoring integrated circuit according to claim 1, wherein the at least one first-class mode of operation comprises a self-diagnostic mode of operation.

7. A battery monitoring apparatus comprising:
    a monitoring integrated circuit (IC) that is electrically connected to a high-voltage battery formed of a plurality of cells and configured to monitor the high-voltage battery in a plurality of modes of operation, the plurality of modes of operation including at least one first-class mode of operation, in which the power consumption of the monitoring IC is equal to or greater than a predetermined value, and at least one second-class mode of operation, in which the power consumption of the monitoring IC is less than the predetermined value; and
    a low-voltage power supply circuit configured to deliver power that is lower in voltage than the power of the high-voltage battery from a low-voltage battery to the monitoring IC, the low-voltage battery being separate from the high-voltage battery,
    wherein a power supply to the monitoring IC is selected from a group of the high-voltage battery and the low-voltage power supply circuit depending on the mode of operation of the monitoring IC,
    the apparatus is mounted in a vehicle including an ignition switch,
    when the ignition switch is on, the battery monitoring apparatus is placed in one of the at least one first-class mode of operation and the monitoring IC is then powered by the low-voltage power supply circuit,
    when the ignition switch is off, the battery monitoring apparatus is placed in one of the at least one second-class mode of operation and the monitoring IC is then powered only by the high-voltage battery,
    the at least one second-class mode of operation includes a sleep mode of operation, in which none of various control functions are executed, and an equalization mode of operation, in which the plurality of cells forming the high-voltage battery are equalized in capacity, and
    the low-voltage power supply circuit comprises a transformer formed of a pair of primary and secondary coils, and power originating from the low-voltage battery is delivered to the monitoring IC through the transformer of the low-voltage power supply circuit.

* * * * *